(12) United States Patent
Hirakoso et al.

(10) Patent No.: US 6,521,770 B2
(45) Date of Patent: Feb. 18, 2003

(54) ORGANOZIRCONIUM COMPOUND, ORGANIC SOLUTION COMPRISING SAME, AND ZIRCONIUM-CONTAINING THIN FILM THEREFROM

(75) Inventors: Hideyuki Hirakoso, Saitama (JP); Shingo Okamura, Saitama (JP); Hiroto Uchida, Saitama (JP); Katsumi Ogi, Saitama (JP)

(73) Assignee: Mitsubishi Materials Corporation, Tokyo (JP)

( * ) Notice: Subject to any disclaimer, the term of this patent is extended or adjusted under 35 U.S.C. 154(b) by 24 days.

(21) Appl. No.: 09/839,367

(22) Filed: Apr. 23, 2001

(65) Prior Publication Data
US 2002/0012819 A1 Jan. 31, 2002

(30) Foreign Application Priority Data

| | | |
|---|---|---|
| Apr. 21, 2000 | (JP) | 2000-120473 |
| Jan. 12, 2001 | (JP) | 2001-004626 |
| Feb. 22, 2001 | (JP) | 2001-045877 |

(51) Int. Cl.$^7$ ............................ C07F 7/00; C23C 16/40; C09K 3/00
(52) U.S. Cl. ............... 556/40; 106/287.19; 427/255.31; 427/255.36; 501/134
(58) Field of Search ...................... 556/40; 106/287.19; 427/255.31, 255.36; 501/134

(56) References Cited

U.S. PATENT DOCUMENTS

| | | | | |
|---|---|---|---|---|
| 6,258,157 B1 | * | 7/2001 | Gordon | 106/287.24 |
| 6,280,518 B1 | * | 8/2001 | Itsuki et al. | 106/287.19 |
| 6,376,692 B1 | * | 4/2002 | Kadokura et al. | 556/40 |
| 6,383,669 B1 | * | 5/2002 | Leedham et al. | 428/702 |

* cited by examiner

*Primary Examiner*—Porfirio Nazario-Gonzalez
(74) *Attorney, Agent, or Firm*—Oblon, Spivak, McClelland, Maier & Neustadt, P.C.

(57) ABSTRACT

An organozirconium compound comprises zirconium complexed with a β-diketone compound and an alkoxy group having a branched alkyl group, and which has formula (1):

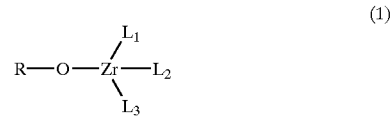

(1)

wherein R is a branched alkyl group having 4 or 5 carbons; and $L_1$, $L_2$, and $L_3$, the same or different from each other, are each a β-diketone compound.

15 Claims, 3 Drawing Sheets

ORGANOZIRCONIUM COMPOUND, ORGANIC SOLUTION COMPRISING SAME, AND ZIRCONIUM-CONTAINING THIN FILM THEREFROM

BACKGROUND OF THE INVENTION

1. Field of the Invention

The present invention relates to an organozirconium compound and an organic solution comprising the compound for the preparation of a zirconium-containing thin film by the Metal Organic Chemical Vapor Deposition method (referred to as MOCVD hereinafter), and also relates to a zirconium containing thin film formed using the organozirconium compound and an organic solution of the compound. More particularly, the present invention relates to an organozirconium compound and an organic solution comprising the compound for preparing a $Pb(Zr,Ti)O_3$ (referred to as PZT hereinafter) thin film by the MOCVD method in the preparation of ferro-electric memories.

2. Description of the Background

An organozirconium compound which is known to be useful in the MOCVD method (referred to as MOCVD-organozirconium compound hereinafter) is zirconium tetra (2,2,6,6-tetramethyl-3,5-heptadionate) (referred to as $Zr(thd)_4$ hereinafter). Another compound known to be useful in the MOCVD method is the organolead compound, lead bis(2,2,6,6-tetramethyl-3,5-heptadionate) (referred to as $Pb(thd)_2$ hereinafter). Still another useful compound in the MOCVD method is diisopropoxy titanium bis(2,2,6,6-tetramethyl-3,5-heptadionate) (referred to as $Ti(iPro)_2(thd)_2$ hereinafter).

However, it is reported that $Zr(thd)_4$, as an MOCVD-organozirconium compound, exhibits the problem that the film deposition temperature of $Zr(thd)_4$ deviates from the temperatures of the other two compounds when forming a PZT thin film, since $Zr(thd)_4$ has a higher decomposition temperature in comparison to that of $Pb(thd)_2$, which is an MOCVD-organolead compound and that of $Ti(iPro)_2(thd)_2$, which is an MOCVD-organotitanium compound (Anthony C. Jones et al., Journal of the European Ceramic Society, 19 (1999) 1431–1434). To solve this problem, it has been proposed to use tetratertiarybutoxy zirconium (referred to as $Zr(tBuO)_4$ hereinafter) in this role, since it has a low decomposition temperature. However, this compound is extremely reactive with the air, and therefore, has the different problem of being extremely difficult to handle.

Compared to this, published PCT application WO98/51837 (PCT application number: PCT/GB98/01365), describes new organozirconium compounds which are useful in the MOCVD method, which are diisopropoxy zirconium bis(2,2,6,6-tetramethyl-3,5-heptadionate) (referred to as $Zr(iPrO)_2(thd)_2$ hereinafter), ditertiarybutoxy zirconium bis(2,2,6,6-tetramethyl-3,5-heptadionate) (referred to as $Zr(tBuO)_2(thd)_2$ hereinafter), $Zr_2(iPrO)_6(thd)_2$, and the like. These compounds are superior to the above-described conventional compounds in that they can be used for film deposition over a wide temperature range.

In the meantime, Okuhara et al., have proposed a new organozirconium compound for the MOCVD method which is isopropoxy zirconium tris(2,2,6,6-tetramethyl-3,5-heptadionate) (referred to as $Zr(iPrO)_1(thd)_3$ hereinafter). This compound exhibits a high vapor pressure as a monomer and is readily soluble in a solvent (47th Applied Physics-related Joint Lectures, Preliminary Report, (March, 2000), p.540).

However, organozirconium compounds such as $Zr(iPrO)_2(thd)_2$, $Zr(tBuO)_2(thd)_2$, and $Zr_2(iPrO)_6(thd)_2$, which are described in published PCT application WO98/51837, exhibit the problem of tending to react with the above-described $Pb(thd)_2$ and similar compounds, leaving large amounts of unvaporized residues at vaporization, when the compounds are mixed with them in order to form a PZT thin film by the MOCVD method.

Regarding the organozirconium compounds represented by $Zr(iPrO)_1(thd)_3$ described by Okuhara et al. above, they leave large amounts of residue upon vaporization. Moreover, if the compounds are mixed with other compounds such as $Pb(thd)_2$, they also tend to react with each other, further increasing residues upon vaporization. This poses another problem.

SUMMARY OF THE INVENTION

Accordingly, one object of the present invention is to provide an organozirconium compound having a decomposition temperature which is lower in comparison to those of the above-described conventional MOCVD organozirconium compounds and which is near to the decomposition temperatures of MOCVD organolead compounds and organotitanium compounds.

Another object of the present invention is to provide an organozirconium compound which, upon vaporization, only leaves a small amount of residue.

Still another object of the present invention is to provide an organozirconium compound which only reacts with difficulty with either one or both of an MOCVD organolead compound and an MOCVD organotitanium compound and, when mixed with these compounds and upon vaporization of the mixture, leaves only a small amount of residue.

Yet another object of the present invention is to provide an organic solution which enables more accurate control of the composition of a PZT thin film.

Still another object of the present invention is to provide a zirconium-containing thin which is uniform and easily controllable.

Briefly, these objects and other objects of the present invention as hereinafter will become more readily apparent can be attained by an organozirconium compound which comprises zirconium combined with β-diketone compounds and an alkoxy group having a branched alkyl group, and which is represented by formula (1):

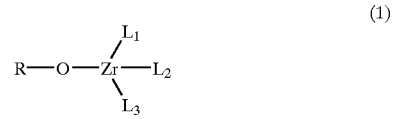

(1)

wherein R is a branched alkyl group having 4 or 5 carbons; and $L_1$, $L_2$, and $L_3$, are the same or different from each other, and each are a β-diketone compound.

DETAILED DESCRIPTION OF THE PREFERRED EMBODIMENTS

Since the central metal in the organozirconium compound of the first aspect of the present invention has an alkoxy group having a bulky branched alkyl group and β-diketone compound ligands coordinated to the zirconium atom at a metal to ligand ratio of 1:3, the compound itself leaves only small amounts of residues upon vaporization of the complex. For the same reason, the complex has a decomposition temperature near those of organolead compounds and organotitanium compounds, and when mixed with them, it is hard to react the zirconium complex with the organolead compounds and organotitanium compounds, leaving only small amounts of residues upon vaporization.

The second aspect of the present invention is an organic solution comprising the organozirconium compound of the first aspect of the present invention dissolved in an organic solvent together with either one or both of Pb(thd)$_2$ and Ti(OR')$_2$(thd)$_2$. The second aspect of the present invention also encompasses an organic solution comprising an organozirconium compound of the first aspect of the present invention dissolved in an organic solvent together with either one or both of Pb(tod)$_2$ and Ti(OR')$_2$(tod)$_2$. Here, thd is a 2,2,6,6-tetramethyl-3,5-heptadionate group, tod is a 2,2,6,6-tetramethyl-3,5-octadionate group, and R' is a straight-chain or branched alkyl group having 3 to 5 carbons.

During film deposition, the organic solution comprising an organozirconium compound of the first aspect of the present invention, which is mixed and dissolved in an organic solvent together with Pb(thd)$_2$, Ti(OR')$_2$(thd)$_2$, Pb(tod)$_2$, or Ti(OR')$_2$(tod)$_2$, does not cause an increase of residues upon vaporization as a result of mixing and, therefore, can be stably supplied to an MOCVD apparatus. Furthermore, since vaporization temperatures and decomposition temperatures of the organozirconium compound, organolead compound, and organotitanium compound are near each other, it is possible to improve control of the composition of a PZT thin film.

The second aspect of the present invention is a raw material solution, wherein R' is the same as the branched alkyl group (R) represented in formula (1) shown in the first aspect of the present invention.

By selecting the same group for R and R', the problem of exchange of alkoxy groups is solved, and changes in characteristics of the compounds are limited.

BRIEF DESCRIPTION OF THE DRAWINGS

A more complete appreciation of the invention and many of the attendant advantages thereof will be readily obtained as the same becomes better understood by reference to the following detailed description when considered in connection with the accompanying drawings, wherein.

Figure 1:
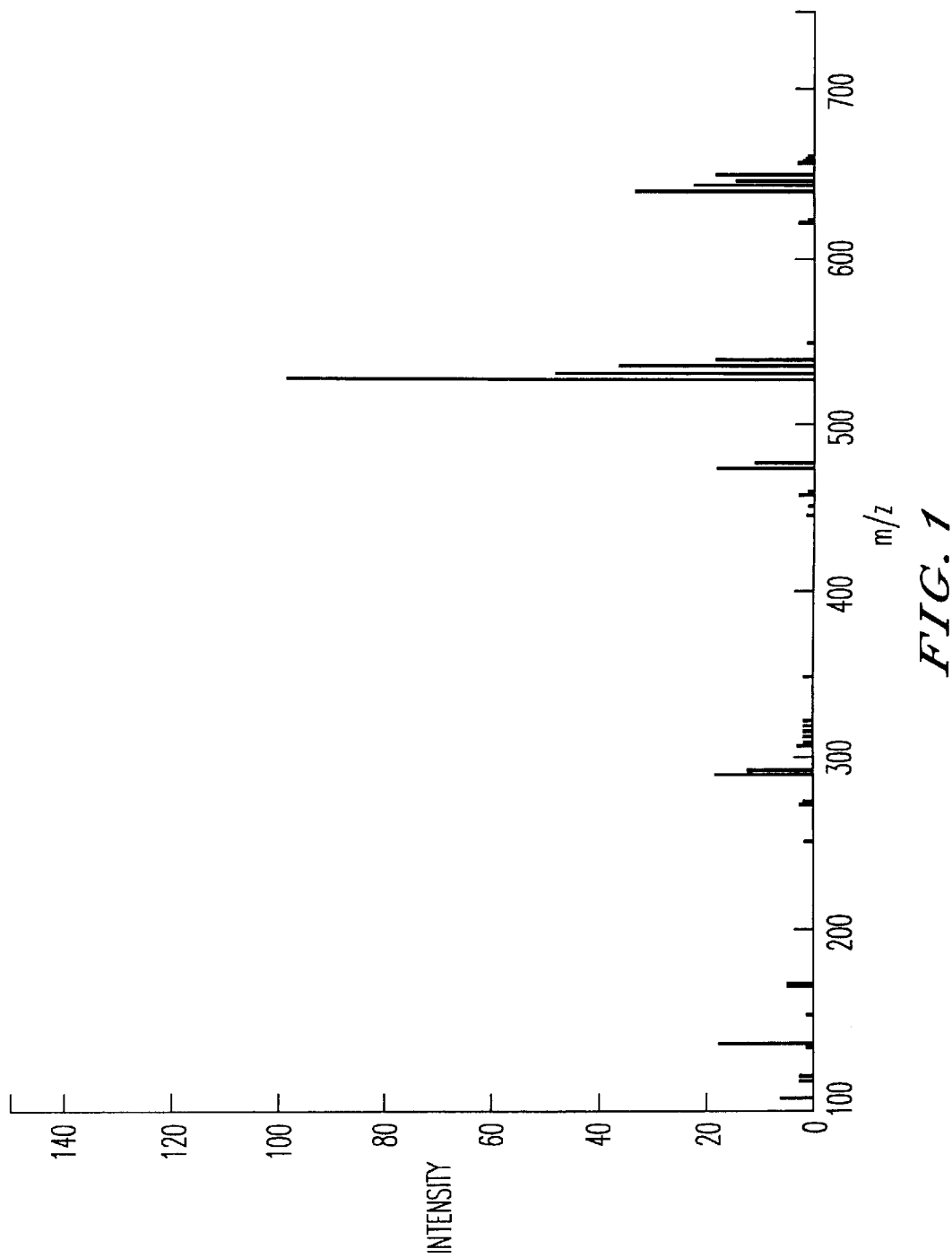
FIG. 1 is a graph of the mass spectrum of the purified powder product (Zr(tBuO)$_1$(thd)$_3$) of Example 1.

The organozirconium compound of the present invention is a compound having formula (1). R of formula (1) is a branched alkyl group having 4 or 5 carbons, and L$_1$, L$_2$, and L$_3$, the same or different from each other, are each a ligand of a β-diketone compound. When the number of carbon atoms in R is three or less, a problem is encountered of reactions occurring with other organolead compounds or organotitanium compounds when the organozirconium compound is mixed with these compounds. When the number is six or more, a problem which is encountered is that the alkoxy group decomposes leaving carbon in the film which is formed. Furthermore, if a straight-chain alkyl group is used as the alkyl group, reactions between the compounds tend to occur easily and control of the reactions when the organozirconium compound is mixed with other organolead compounds or organotitanium compounds is more difficult, since the alkyl group is less bulky. Therefore, a branched alkyl group is selected as the alkyl group in the present invention.

A tertiary alkoxy group is preferred as the alkoxy group (OR) having a branched alkyl group in the formula (1). Because the alkoxy group is bulky, reactions between the compounds can be limited. The tertiary butyl group and the tertiary amyl group are preferred as the branched alkyl group (R), since they are bulky in addition to their relatively small number of carbons and, therefore, leave only a small amount of carbon residues in the film at film deposition.

Furthermore, the β-diketone compound (L$_1$, L$_2$, or L$_3$) in formula (1) has the structure shown in formula (2).

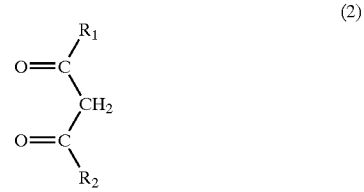

(2)

Here, R$_1$ and R$_2$ are each selected from the group consisting of methyl, ethyl, normal propyl, isopropyl, normal butyl, isobutyl, tertiary butyl, tertiary pentyl, neopentyl, trifluoromethyl and pentafluoroethyl. Such a group is selected based on the fact that when the organozirconium compound is mixed with other organolead compounds or organotitanium compounds, reactions between the compounds are limited, carbon residues in a film which is formed caused by decomposition are reduced, and the coordinated compounds have a certain level of vapor pressure.

It is possible to dissolve only an organozirconium compound of the present invention in an organic solvent to form an organic solution, and then to form a zirconium-containing thin film according to the present invention, using the organic solution as a raw material solution. Furthermore, it is possible to form a PZT thin film using an organic solution of the present invention. To form this PZT thin film, an organic solution is prepared by dissolving an organozirconium compound of the present invention in an organic solvent together with Pb(thd)$_2$ and Ti (OR')$_2$(thd)$_2$, or Pb (tod)$_2$, and Ti(OR')$_2$(tod)$_2$. Suitable organic solvents include tetrahydrofuran, methyltetrahydrofuran, butyl acetate, octane, and the like.

The above-described zirconium-containing thin film or PZT thin film is uniform. Further, by using the organozirconium compound of the present invention, control of the method of preparing the film product therefrom is easy.

Having now generally described this invention, a further understanding can be obtained by reference to certain specific examples which are provided herein for purposes of illustration only and are not intended to be limiting unless otherwise specified.

Examples of the present invention are described together with Comparative Examples. Examples 1 to 3 show how to synthesize organozirconium compounds of the present invention, while Comparative Examples 1 to 6 show how to synthesize organozirconium compounds of the prior art.

EXAMPLE 1

Zr(tBuO)$_4$ in an amount of 5.0 g (0.013 mol) was dissolved in 500 cc of toluene to form a solution. 2,2,6,6-Tetramethyl-3,5-heptadione (referred to as Hthd hereinafter) in an amount of 7.2 g (0.039 mol) was titrated into this solution, followed by reaction with heating and refluxing at 110° C. for 4 hours. Toluene in this reaction solution was removed under a reduced pressure to form a crude product. This crude product was recrystallized in hexane to provide a purified powder product. This purified product was subjected to analysis with a mass analyzer. The mass spectrum is shown in FIG. 1. From the mass spectrum, the purified product was identified as tertiarybutoxy zirconium tris(2,2,6,6-tetramethyl-3,5-heptadionate) (referred to as $Zr(tBuO)_1(thd)_3$ hereinafter).

EXAMPLE 2

Figure 2:
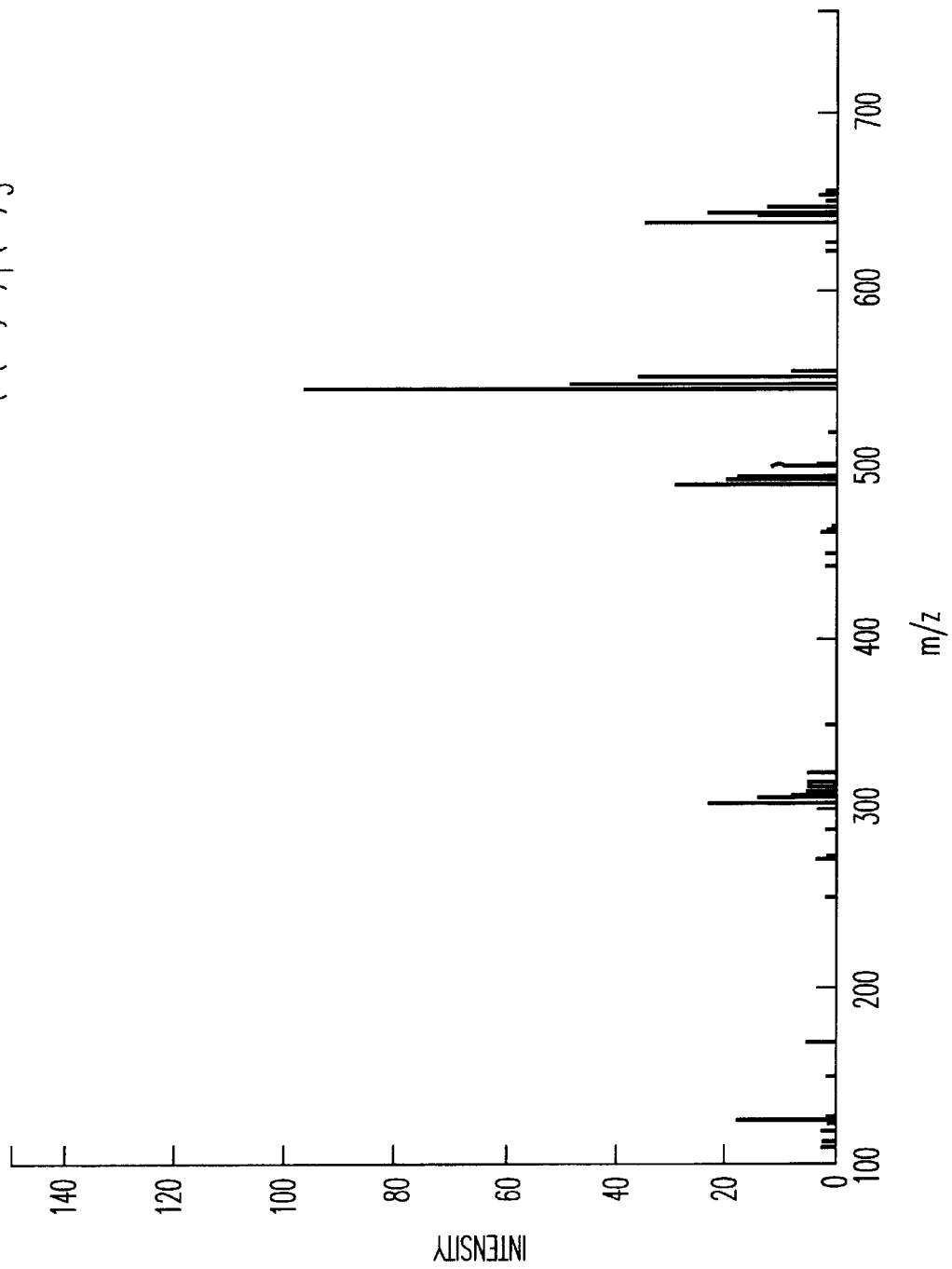
FIG. 2 is a graph of the mass spectrum of the purified powder product (Zr(tAmylO)$_1$(thd)$_3$) of Example 2.

Tetra(2-methyl-2-butoxy) zirconium (or tetratertiaryamyloxy zirconium, referred to as $Zr(tAmylO)_4$ hereinafter) in an amount of 5.7 g (0.013 mol) was dissolved in 500 cc of toluene to form a solution. Hthd in an amount of 7.2 g (0.039 mol) was titrated into this solution, followed by reaction with heating and refluxing in the same way described in Example 1. Toluene in this reaction solution was removed under reduced pressure to form a crude product. This crude product was recrystallized in hexane to provide a purified powder product. The mass spectrum of this purified product is shown in FIG. 2. From the mass spectrum, the purified product was identified as tertiaryamyloxy zirconium tris(2,2,6,6-tetramethyl-3,5-heptadionate) (referred to as $Zr(tAmylO)_1(thd)_3$ hereinafter).

EXAMPLE 3

$Zr(tHuO)_4$ in an amount of 5.0 g (0.013 mol) was dissolved in 500 cc of toluene to form a solution. 2,2,6,6-Tetramethyl-3,5-octadione (referred to as Htod hereinafter) in an amount of 7.7 g (0.039 mol) was titrated into this solution, followed by reaction with heating and refluxing in the same way described in Example 1. Toluene in this reaction solution was removed under a reduced pressure to form a crude product. This crude product was recrystallized in hexane to provide a purified powder product. From the mass spectrum of this purified product (not shown), the purified product was identified as tertiarybutoxy zirconium tris(2,2,6,6-tetramethyl-3,5-octadionate) (referred to as $Zr(tBuO)_1(tod)_3$ hereinafter).

COMPARATIVE EXAMPLE 1

$Zr(thd)_4$ was synthesized by the following method. That is, $Zr(tBuO)_4$ in an amount of 5.0 g (0.013 mol) was dissolved in 500 cc of toluene to form a solution. Hthd in an amount of 9.5 g (0.052 mol) was titrated into this solution, followed by reaction with heating and refluxing in the same way described in Example 1. Toluene in this reaction solution was removed under a reduced pressure to form a crude product. This crude product was recrystallized in hexane to provide a purified powder product.

COMPARATIVE EXAMPLE 2

$Zr(tBuO)_2(thd)_2$ was synthesized by the following method. $Zr(tBuO)_4$, in an amount of 5.0 g (0.013 mol), was dissolved in 500 cc of toluene to form a solution. Hthd in an amount of 4.8 g (0.026 mol) was titrated into this solution, followed by reaction with heating and refluxing in the same way described in Example 1. Toluene in this reaction solution was removed under a reduced pressure to form a crude product. This crude product was recrystallized in hexane to provide a purified powder product.

COMPARATIVE EXAMPLE 3

$Zr(tAmylO)_2(thd)_2$ was synthesized by the following method. $Zr(tAmylO)_4$, in an amount of 5.6 g (0.013 mol), was dissolved in 500 cc of toluene to form a solution. Hthd in an amount of 4.8 g (0.026 mol) was titrated into this solution, followed by reaction with heating and refluxing in the same way described in Example 1. Toluene in this reaction solution was removed under a reduced pressure to form a crude product. This crude product was recrystallized in hexane to provide a purified powder product.

COMPARATIVE EXAMPLE 4

$Zr_2(iPrO)_6(thd)_2$ was synthesized by the following method. $Zr(iPrO)_4$, in an amount of 4.3 g (0.013 mol), was dissolved in 500 cc of toluene to form a solution. Hthd in an amount of 2.4 g (0.013 mol) was titrated into this solution, followed by reaction with heating and refluxing in the same way described in Example 1. Toluene in this reaction solution was removed under a reduced pressure to form a crude product. This crude product was recrystallized in hexane to provide a purified powder product.

COMPARATIVE EXAMPLE 5

$Zr(iPrO)_1(thd)_3$ was synthesized by the following method. $Zr(iPrO)_4$, in an amount of 4.3 g (0.013 mol), was dissolved in 500 cc of toluene to form a solution. Hthd in an amount of 7.2 g (0.039 mol) was titrated into this solution, followed by reaction with heating and refluxing in the same way described in Example 1. Toluene in this reaction solution was removed under a reduced pressure to form a crude product. This crude product was recrystallized in hexane to provide a purified powder product.

COMPARATIVE EXAMPLE 6

$Zr(nBuO)_1(thd)_3$ was synthesized by the following method. $Zr(nBuO)_4$, in an amount of 5.0 g (0.013 mol), was dissolved in 500 cc of toluene to form a solution. Hthd in an amount of 7.2 g (0.039 mol) was titrated into this solution, followed by reaction with heating and refluxing in the same way described in Example 1. Toluene in this reaction solution was removed under a reduced pressure to form a crude product. This crude product was recrystallized in hexane to provide a purified powder product.

COMPARATIVE EVALUATION (a) Thermogravimetric Analysis

Figure 3:
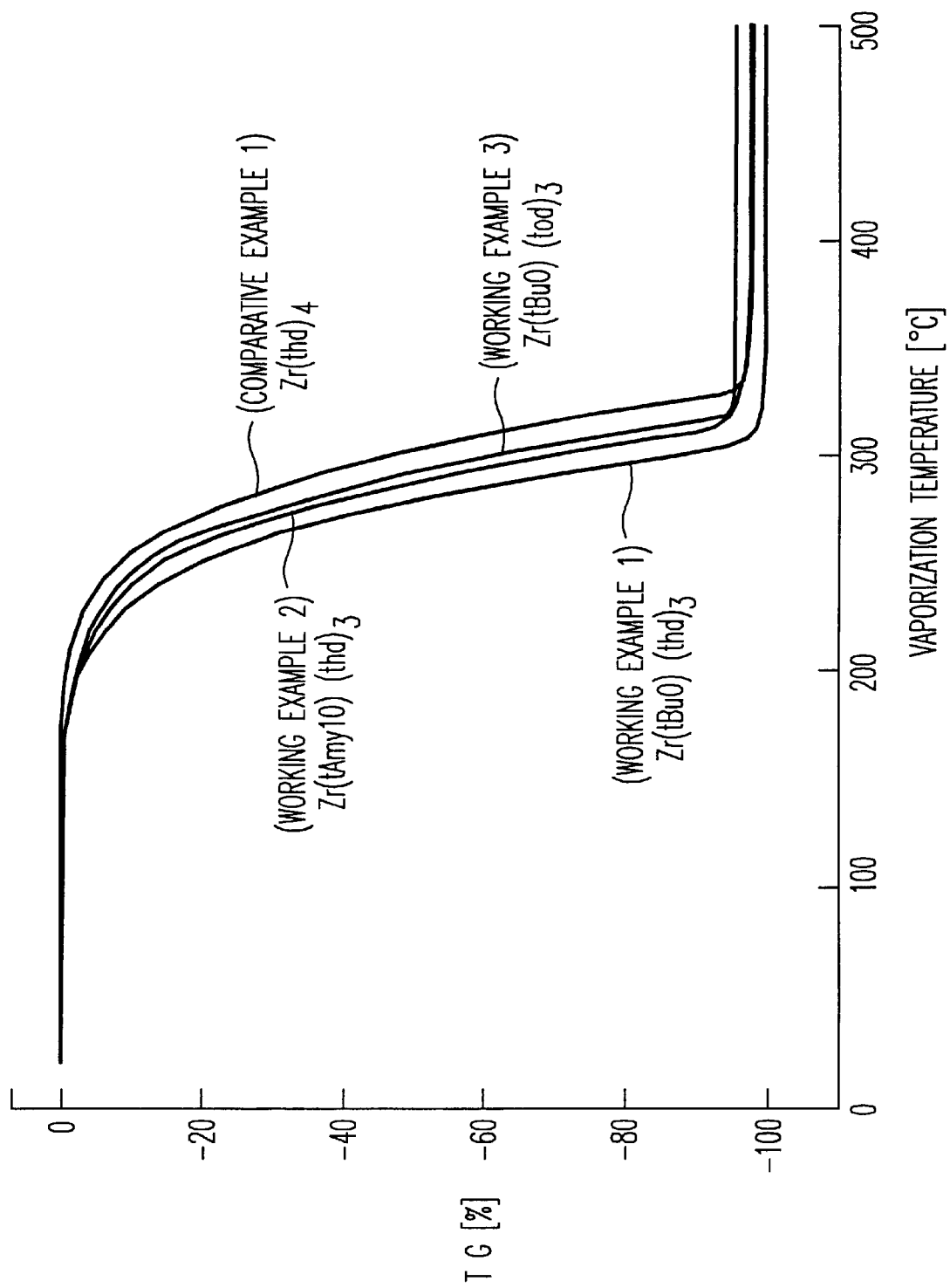
FIG. 3 is a graph of the results of thermogravimetric analysis of the organozirconium compounds described in Examples 1 to 3 and Comparative Example 1, respectively.

Results of thermogravimetric analysis (TG) of the purified powder products (organozirconium compounds) described in Examples 1, 2, and 3, as well as in comparative Example 1, are shown in FIG. 3, respectively. As is evident from FIG. 3, all of Examples 1 to 3 as indicated with solid lines show lower vaporization temperatures in comparison with Comparative Example 7, indicated with a dotted line. Specifically, the organozirconium compound described in Example 1 has an excellent vaporization temperature.

(b) Thermal Decomposition Temperature

The thermal decomposition temperatures of the purified powder products (organozirconium compounds) described in Examples 1, 2, and 3, as well as in Comparative Example 1 were investigated, respectively. Furthermore, the thermal decomposition temperatures of $Pb(thd)_2$ as an organolead compound and $Ti(iPrO)_2(thd)_2$ as an organotitanium compound were also investigated, respectively. The results are shown in Table 1. As is evident from Table 1, it is understood that the decomposition temperatures of the organozirconium compounds described in Examples 1 to 3 are nearer to those of Pb(thd)$_2$ and Ti(iPrO)$_2$(thd)$_2$ as an organotitanium compound in comparison with the organozirconium compound described in Comparative Example 1.

TABLE 1

| | Organometallic compound | Thermal composition temperature (° C.) |
|---|---|---|
| Example 1 | Zr(tBuO)$_1$(thd)$_3$ | 340 |
| Example 2 | Zr(tAmylO)$_1$(thd)$_3$ | 360 |
| Example 3 | Zr(tBuO)$_1$(thd)$_3$ | 330 |
| Comparative Example 1 | Zr(thd)$_4$ | 410 |
| — | Pb(thd)$_2$ | 325 |
| — | Ti(iPrO)$_3$(thd)$_3$ | 280 |

(c) Residues at Vaporization before and after Mixing with an Organolead Compound The residues at vaporization of the purified powder products (organozirconium compounds) described in Examples 1 to 3, as well as in Comparative Examples 2 to 5, were investigated in a single state, respectively. The residues obtained upon vaporization of mixtures of purified powder products with an organolead compound were also investigated, respectively.

The residues remaining after vaporization of the organozirconium compounds described in Examples 1 to 3, as well as in Comparative Examples 2 to 5, before mixing with an organolead compound were investigated in a single state, respectively, by performing thermogravimetric analysis (TG) by heating them up to 500° C. in an argon atmosphere.

The residues remaining after vaporization of mixtures of organozirconium compounds with an organolead compound were investigated by the following method. First, each of the organozirconium compounds described in Examples 1 to 3, as well as in Comparative Examples 2 to 5, was mixed with Pb(thd)$_2$ in are argon atmosphere. Each mixture was then dissolved in tetrahydrofuran as an organic solvent, and each solution was divided in half. One half of a solution was stored in an argon atmosphere under light shielding conditions for one month. The other half was stored in the same atmosphere for three months, and the solvents were removed under reduced pressure upon the termination of the term of storage. After that,.thermogravimetric analysis (TG) was performed by heating the stored solutions up to 500° C. in an argon atmosphere to check the amount of residue which had formed in each solution. The results are shown in Table 2.

TABLE 2

| | | Residues at vaporization (wt. %) | | |
|---|---|---|---|---|
| | | | Storing time after mixing | |
| | Organo Zr compound | Before mixing | One month | Three months |
| Example 1 | Zr(tBuO)$_1$(thd)$_3$ | 0 | 0.9 | 0.9 |
| Example 2 | Zr(tAmylO)$_1$(thd)$_3$ | 2.1 | 3.3 | 3.2 |
| Example 3 | Zr(tBuO)$_1$(tod)$_3$ | 2.6 | 4.0 | 3.8 |
| Comparative Example 2 | Zr(tBuO)$_2$(thd)$_2$ | 7.5 | 13.4 | 16.2 |
| Comparative Example 3 | Zr(tAmylO)$_2$(thd)$_2$ | 7.2 | 9.8 | 11.6 |
| Comparative | Zr$_2$(iPrO)$_6$(thd)$_2$ | 6.8 | 11.8 | 14.5 |

TABLE 2-continued

| | | Residues at vaporization (wt. %) | | |
|---|---|---|---|---|
| | | | Storing time after mixing | |
| | Organo Zr compound | Before mixing | One month | Three months |
| Example 4 Comparative Example 5 | Zr(iPrO)$_1$(thd)$_3$ | 9.5 | 10.1 | 11.5 |

As is evident from the data in Table 2, before mixing each of the organozirconium compounds shown with Pb(thd)z, while the organozirconium compounds described in Comparative Examples 2 to 5 produced 6.8 to 9.5% by weight of residues at vaporization, the organozirconium compounds described in Examples 1 to 3 produced only 0 to 2.6% by weight of residues at vaporization. Furthermore, subsequent to one-month storage after mixture of a given organozirconium compound with Pb(thd)$_2$, while the organozirconium compounds described in Comparative Examples 2 to 5 produced 9.8 to 13.4% by weight of residues at vaporization, the organozirconium compounds described in Examples 1 to 3 produced only 0.9 to 4.0% by weight of residues upon vaporization. After storage for three months, while the organozirconium compounds described in Comparative Examples 2 to 5 produced 11.5 to 16.2% by weight of residues upon vaporization, the organozirconium compounds described in Examples 1 to 3 produced only 0.9 to 3.8% by weight of residues upon vaporization. In particular, the organozirconium compound described in Example 1 was excellent with regard to this matter.

(d) Vaporization Test after Mixing with other Organometallic Compounds

The purified powder products (organozirconium compounds) described in Examples 1 to 3, as well as in Comparative Examples 5 and 6, were mixed with the organolead compound, or mixed with the organolead compound and the organotitanium compounds as shown in Table 3, and then dissolved in the organic solvents shown in Table 3. The solutions obtained were vaporized respectively under the conditions indicated in Table 4 using a vaporizer commercially available as a vaporizer for an MOCVD apparatus. The results are shown in Table 3. Here, the amounts of residue were calculated according to the following equation after recovering residues upon vaporization.

Amount of residue=(weight of residues at vaporization/weight of the compounds before dissolution)×100 (%)

In Table 3, THF indicates the organic solvent tetrahydrofuran, and MeTHF indicates the organic solvent methyltetrahydrofuran.

TABLE 3

|  | Organo Zr compound | Organo Pb compound | Organo Ti compound | Organic solvent | Residue rate (%) |
|---|---|---|---|---|---|
| Ex. 1 | Zr(tBuO)$_1$(thd)$_3$ | Pb(thd)$_2$ | — | THF | 0.1 |
| Ex. 1 | Zr(tBuO)$_1$(thd)$_3$ | Pb(thd)$_2$ | Ti(iPrO)$_2$(thd)$_2$ | THF | 1.2 |
| Ex. 1 | Zr(tBuO)$_1$(thd)$_3$ | Pb(thd)$_2$ | Ti(tBuO)$_2$(thd)$_2$ | THF | 0.5 |
| Ex. 1 | Zr(tBuO)$_1$(thd)$_3$ | Pb(thd)$_2$ | Ti(tAmylO)$_2$(thd)$_2$ | MeTHF | 0.8 |
| Ex. 2 | Zr(tAmylO)$_1$(thd)$_3$ | Pb(thd)$_2$ | — | MeTHF | 0.3 |
| Ex. 2 | Zr(tAmylO)$_1$(thd)$_3$ | Pb(thd)$_2$ | Ti(tBuiPrO)$_2$(thd)$_2$ | THF | 0.7 |
| Ex. 3 | Zr(tBuO)$_1$(tod)$_3$ | Pb(thd)$_2$ | Ti(tAmylO)$_2$(thd)$_2$ | Octane | 1.2 |
| Comp. Ex. 5 | Zr(iPrO)$_1$(thd)$_3$ | Pb(thd)$_2$ | — | THF | 2.0 |
| Comp. Ex. 5 | Zr(iPrO)$_1$(thd)$_3$ | Pb(thd)$_2$ | Ti(iPrO)$_2$(thd)$_2$ | THF | 6.3 |
| Comp. Ex. 6 | Zr(nBuO)$_1$(thd)$_3$ | Pb(thd)$_2$ | Ti(iPrO)$_2$(thd)$_2$ | THF | 7.1 |

TABLE 4

| Vaporization condition | Vaporization temperature | 250° C. |
|---|---|---|
|  | Vaporization pressure | 4,000 Pa |
|  | Flow amount of raw material | 0.2 cc/min |
|  | N$_2$ flow amount | 200 sccm |
|  | Test period | 80 hrs |

As is evident from Table 3, the vaporization properties after mixing the organozirconium compounds described in Examples 1 to 3 with other organometallic compounds are extremely excellent as evidenced by their extremely small amounts of residue produced in the range from 0.1 to 1.2% in comparison to those of Comparative Examples 5 and 6 in the range from 2.0 to 7.1%.

As described above, the organozirconium compound of the present invention has a lower vaporization temperature and a lower decomposition temperature in comparison with the prior art Zr(thd)$_4$, and does not produce increases amounts of residues upon vaporization when mixed with Pb(thd)$_2$. Furthermore, the compound shows excellent vaporization properties when a vaporizer is used. Accordingly, when the compound of the present invention is used as an organozirconium compound in film deposition to produce a PZT thin film by an MOCVD method, the organic solutions, as the raw materials, can be supplied to the MOCVD apparatus in a stable manner, since there is no increase of residues formed upon vaporization caused by mixing of the organozirconium compound with an organolead compound or an organotitanium compound. Furthermore, control of film composition can be made more accurately, since the vaporization temperature and the decomposition temperature are near to those of organolead compounds and organotitanium compounds.

The disclosures of Japanese priority applications Ser. Nos. 2000-120473 and 2001-004626 filed Apr. 21, 2000 and Jan. 12, 2001 are hereby incorporated by reference into lower vaporization temperature and a lower decomposition temperature in comparison with the prior art Zr(thd)$_4$, and does not produce increases amounts of residues upon vaporization when mixed with Pb(thd)$_2$. Furthermore, the compound shows excellent vaporization properties when a vaporizer is used. Accordingly, when the compound of the present invention is used as an organozirconium compound in film deposition to produce a PZT thin film by an MOCVD method, the organic solutions, as the raw materials, can be supplied to the MOCVD apparatus in a stable manner, since there is no increase of residues formed upon vaporization caused by mixing of the organozirconium compound with an organolead compound or an organotitanium compound.

Furthermore, control of film composition can be made more accurately, since the vaporization temperature and the decomposition temperature are near to those of organolead compounds and organotitanium compounds.

The disclosures of Japanese priority applications Ser. Nos. 2000-120473, 2001-004626 and 2001-045877 filed Apr. 21, 2000, Jan. 12, 2001 and Feb. 22, 2001 are hereby incorporated by reference into the present application.

Obviously, numerous modifications and variations of the present invention are possible in light of the above teachings. It is therefore to be understood that within the scope of the appended claims, the invention may be practiced otherwise than as specifically described herein.

What is claimed as new and is intended to be secured by Letters Patent is:

1. An organozirconium compound which comprises zirconium combined with a β-diketone compound and an alkoxy group having a branched alkyl group, and which has formula (1):

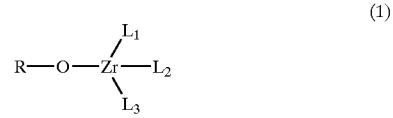

(1)

wherein R is a branched alkyl group having 4 or 5 carbons; and L$_1$, L$_2$, and L$_3$, the same or different from each other, are each a β-diketone compound.

2. The organozirconium compound according to claim 1, wherein the alkoxy group (OR) having a branched alkyl group is a tertiary alkoxy group.

3. The organozirconium compound according to claim 1, wherein the branched alkyl group (R) is a tertiary-butyl group or a tertiary-amyl group.

4. The organozirconium compound according to claim 2, wherein the branched alkyl group (R) is a tertiary-butyl group or a tertiary-amyl group.

5. The organozirconium compound according to claim 1, wherein the β-diketone compound (L$_1$, L$_2$, or L$_3$) has formula (2):

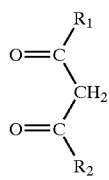
(2)

wherein R₁ and R₂ are each a group selected from the group consisting of methyl, ethyl, normal-propyl, isopropyl, normal-butyl, isobutyl, tertiary-butyl, tertiary-pentyl, neopentyl, trifluoromethyl and pentafluoroethyl.

6. An organic solution comprising an organozirconium compound according to claim 1, wherein the organozirconium compound is dissolved in an organic solvent together with at least one of Pb(thd)$_2$ or Ti(OR')$_2$(thd)$_2$, in which thd is a 2,2,6,6-tetramethyl-3,5-heptadionate group; and R' is a straight-chain or branched alkyl group having 3 to 5 carbons.

7. An organic solution comprising an organozirconium compound according to claim 1, wherein the organozirconium compound is dissolved in an organic solvent together with at least one of Pb(tod)$_2$ or Ti(OR')$_2$(tod)$_2$, in which tod is a 2,2,6,6-tetramethyl-3,5-octadionate group; and R' is a straight-chain or branched alkyl group having 3 to 5 carbons.

8. The organic solution according to claim 6, wherein R' is the same as the branched alkyl group (R) in the compound of formula (1).

9. The organic solution according to claim 7, wherein R' is the same as the branched alkyl group (R) in the compound of formula (1).

10. The organic solution according to claim 6, wherein the organic solvent is tetrahydrofuran, methyl tetrahydrofuran, butyl acetate or octane.

11. The organic solution according to claim 7, wherein the organic solvent is tetrahydrofuran, methyl tetrahydrofuran, butyl acetate or octane.

12. A zirconium-containing thin film prepared by:
chemically depositing an organozirconium compound according to claim 1 onto a substrate.

13. A zirconium-containing thin film prepared by:
chemically depositing an organozirconium compound according to claim 2 onto a substrate.

14. A zirconium-containing thin film prepared by:
forming a film of an organozirconium compound of claim 1 in an organic solution on a substrate.

15. A zirconium-containing thin film prepared by:
forming a film of an organozirconium compound of claim 2 in an organic solution on a substrate.

* * * * *